United States Patent

Jun

[11] Patent Number: 5,882,968
[45] Date of Patent: *Mar. 16, 1999

[54] SEMICONDUCTOR DEVICE FABRICATION METHOD

[75] Inventor: Young Kwon Jun, Seoul, Rep. of Korea

[73] Assignee: LG Semicon Co., Ltd., Choongchungbook-Do, Rep. of Korea

[*] Notice: The term of this patent shall not extend beyond the expiration date of Pat. No. 5,654,223.

[21] Appl. No.: 576,752

[22] Filed: Dec. 21, 1995

[30] Foreign Application Priority Data

Dec. 22, 1994 [KR] Rep. of Korea ................. 1994/36063

[51] Int. Cl.⁶ ............................................... H01L 21/8242
[52] U.S. Cl. ........................... 438/254; 438/701; 438/624
[58] Field of Search ..................... 438/233, 254, 438/256, 262, 266, 700, 701, 713, 624

[56] References Cited

U.S. PATENT DOCUMENTS

| | | | |
|---|---|---|---|
| 5,296,400 | 3/1994 | Park et al. | 438/253 |
| 5,318,925 | 6/1994 | Kim | 438/253 |
| 5,654,223 | 8/1997 | Jun et al. | 438/254 |

Primary Examiner—Tuan H. Nguyen

[57] ABSTRACT

An improved semiconductor device fabrication method capable of improving the insulation characteristic between neighboring electrodes, which includes the steps of a first step which coats a conductive material on an active region of a semiconductor substrate having an active region and a non-active region divided by a field oxide film and forms a first conductive layer; a second step which deposits a first cap layer and a second cap layer in order so as to insulate between the first conductive layer and an upper layer and etches the same mask; a third step which provides ion on the semiconductor substrate with a mask of the thusly etched first conductive layer, a first cap layer, and a second cap layer and forms a source/drain region; a fourth step which forms a side wall spacer at the side surface of the first conductive layer, the first cap layer and the second cap layer and deposits in order a protection film and a contact oxide film at the front surface of the layer made thereby; a fifth step which forms a photo-etching mask on the contact oxide film, etches the protection film and contact oxide film so as to expose a lower source/drain region, so that a contact hole is formed; and a sixth step which coats a conductive material on the front surface of the layer made after forming the contact hole and forms a second conductive layer contacting with the source/drain region in cooperation with the contact hole.

32 Claims, 21 Drawing Sheets

SEMICONDUCTOR DEVICE FABRICATION METHOD

BACKGROUND OF THE INVENTION

1. Field of the Invention

The present invention relates to a semiconductor device fabrication method, and in particular to an improved semiconductor device fabrication method capable of improving an insulation characteristic between neighboring electrodes and a storage capacity of a semiconductor device.

2. Description of the Conventional Art

As is well known to those who skilled in the art, a DRAM is a kind of a semiconductor memory device consisting of a cell selection transistor and a capacitor as a basic cell. The gate of the cell selection transistor is connected to a word line, and the drain thereof is connected to a bit line, and the source thereof is connected to the capacitor having one end connected to the ground. Here, a data storing operation is executed in accordance with an electric charge stored in the capacitor. Recently, 256 MDRAM had been introduced in the industry, and a device having more intensive memory capacity has been widely developed.

The conventional art has been focused upon developing capacitance which is essential in storing data. It was attempted to simply change the construction of a dielectric film or to provide a certain groove on a substrate in the planarized interconnection technology so as to use the groove as a capacitor, or to develop a three dimensional construction capable of depositing a conductive layer on a substrate. Capacitors having various constructions are currently being developed in the industry.

FIG. 1 shows a three dimensional stack type capacitor, which is directed to depositing a conductive layer on the substrate. That is, this capacitor is directed to forming a groove on the substrate, so that it is easier to fabricate the stack type capacitor compared with a trench type capacitor, and it is possible to provide greater capacitance.

In more detail, the stack type capacitor, as shown in FIG. 1, is connected to a source/drain region of the transistor, and the bit lines BL cross the word lines WL.

FIG. 2 shows a conventional stack type capacitor, which includes a field oxide film 20 formed to define an active region and a nonactive region, a gate insulation film and gate electrode 4 formed by depositing and patterning an insulation material and a conductive material on the front surface of a certain construction obtained by forming the field oxide film 20 in order, a source/drain region 2 formed by providing foreign matters on the semiconductor substrate after masking the gate electrode 4, an oxide film 5 formed so as to insulate between the gate electrode 4 and the upper construction thereof, a storage electrode 6 formed by depositing and patterning a conductive material through a contact hole so that the storage electrode 6 is not connected to the source/drain region, a dielectric film formed by depositing a dielectric material on the storage electrode 6, a plate electrode 7 formed by depositing a conductive material on the dielectric film, a contact oxide film 8 formed on the plate electrode 7, a bit line 9 formed by depositing and patterning a conductive material on the contact oxide film 8, an insulation film 10 and a metal wiring layer 12 formed by depositing an insulation material so as to insulate between a bit line and the metal wiring layer 12 after forming the bit line 9.

Here, the bit line 9 is formed at the bottom of a slanted contact hole having an upper portion wider than the lower portion. As shown in FIG. 2, there is a problem in that the insulation film that isolates the gate electrode and the bit line at a portion "A" becomes thin, and when the device has a narrow surface due to the error alignments of the contact mask and the intensity, an electrical short may take place between the gate electrode and the bit line, so that the reliability of the products is decreased.

SUMMARY OF THE INVENTION

Accordingly, it is an object of the present invention to provide semiconductor device fabrication methods which overcome the problems encountered in a conventional semiconductor device fabrication method.

It is another object of the present invention to provide improved semiconductor device fabrication methods capable of improving an insulation characteristic between neighboring electrodes and intensity of a semiconductor device.

To achieve the above objects, in accordance with an aspect of the present invention, there is provided a semiconductor device fabrication method, which includes the steps of a first step which coats a conductive material on an active region of a semiconductor substrate having an active region and a non-active region divided by a field oxide film and forms a first conductive layer; a second step which deposits a first cap layer and a second cap layer in order so as to insulate between the first conductive layer and an upper layer and etches the same mask; a third step which provides ion on the semiconductor substrate with a mask of the thusly etched first conductive layer, a first cap layer, and a second cap layer and forms a source/drain region; a fourth step which forms a side wall spacer at the side surface of the first conductive layer, the first cap layer and the second cap layer and deposits in order a protection film and a contact oxide film at the front surface of the layer made thereby; a fifth step which forms a photo-etching mask on the contact oxide film, etches the protection film and contact oxide film so as to expose a lower source/drain region, so that a contact hole is formed; and a sixth step which coats a conductive material on the front surface of the layer made after forming the contact hole and forms a second conductive layer contacting with the source/drain region in cooperation with the contact hole.

To achieve the above objects, in accordance with another aspect of the present invention, there is provided a semiconductor device fabrication method, which includes a tenth step which coats a conductive material on an active region of a semiconductor substrate divided into an active region and a non-active region by a field oxide film and forms a conductive layer; an eleventh step which forms a cap layer so as to insulate between the first conductive layer and an upper layer and etches the first conductive layer and a cap layer by adopting the same mask; a twelfth step which provides ion to the semiconductor substrate using the etched first conductive layer and a cap layer as a mask and forms a source/drain region; a thirteenth step which forms a side wall spacer at the side wall of the etched first conductive layer and the cap layer and deposits a protection film and a contact oxide film on the front surface of the layer made after forming the side spacer in order; a fourteenth step which forms a photo-etching mask on the contact oxide film and exposes part of the protection film by etching it; a fifteenth step which etches back the remaining contact oxide film and the protection film, exposes the upper portion of the cap layer, and at the same time forms a contact hole by exposing a source/drain region; and a sixteenth step which coats a conductive material on the front surface of the layer made after forming the contact hole and forms a second conductive layer contacting with a source/drain region in cooperation with the contact hole.

To achieve the above objects, in accordance with another aspect of the present invention, there is provided a semiconductor device fabrication method, which includes a seventeenth step which coats a conductive material on an active region of a semiconductor substrate which is divided into an active region and a non-active region by a field oxide film and forms a first conductive layer; an eighteenth step which deposits a first cap layer and a second cap layer so as to insulate between the first conductive layer and an upper layer and etches by adopting the same mask; a nineteenth step which provides ion to the semiconductor substrate with a mask of the etched first conductive layer, the first cap layer and the second cap layer and forms a source/drain region; a twentieth step which forms a side wall spacer of the etched first conductive layer, the first cal layer and the second cap layer and deposits a protection layer and a contact oxide film on the front surface of the layer thereby; a twenty first step which forms a photo-etching mask on the contact oxide film, etches the protection film and the contact oxide film, and exposes part of region of the protection film; a twenty second step which etches back the remaining contact oxide film, the protection film and the upper portion of the side wall spacer in order and exposes the second cap layer and at the same time exposes the lower source/drain region so as to form a contact hole; and a twenty third step which coats a conductive material on the front surface of the layer made after removing the second cap layer and forms a second conductive layer so that it is connected to the source/drain region through a contact hole.

To achieve the above objects, in accordance with another aspect of the present invention, there is provided a semiconductor device fabrication method, which includes a twenty fourth step which coats a conductive material on an active region of a semiconductor substrate which is divided into an active region and a non-active region by a field oxide film and forms a first conductive layer; a twenty fifth step which forms a cap layer so as to insulate between the first conductive later and an upper layer and etches the first conductive layer and the cap layer using the same mask; a twenty sixth step which provides ion to the semiconductor substrate using the etched first conductive layer and the cal layer as a mask and forms a source/drain region; a twenty seventh step which forms side wall spacer at the first conductive layer and the side surfaces of the cap layer and forms a surface varied layer at the front surface of the layer made thereby; a twenty eighth step which deposits a protection film and a contact oxide film on the upper portion of the surface varied layer in order; a twenty ninth step which forms a photo-etching mask on the contact oxide film and etches the protection film and the contact oxide film and exposes part of region of the protection film; a thirtieth step which etches part of the surface varied layer exposed by masking the etched protection film and the contact oxide film, exposes a lower source/drain region, and forms a contact hole; and a thirty first step which coats a conductive material on the front surface of the layer made by forming the contact hole and forms a second conductive layer so that it is connected to the source/drain region through the contact hole.

To achieve the above objects, in accordance with another aspect of the present invention, there is provided a semiconductor device fabrication method, which includes a thirty second step which coats a conductive material on an active region of a semiconductor divided into an active region and a non-active region by a field oxide film and forms a first conductive layer; a thirty third step which forms a cap layer so as to insulate between the first conductive layer and an upper layer and etches the first conductive layer and the cap layer by adopting the same mask; a thirty fourth step which forms a source/drain region by providing ion to the semiconductor substrate in cooperation with the etched first conductive layer and the cap layer as a mask; a thirty fifth step which forms a side wall spacer at the side surfaces of the etched first conductive layer and the cap layer and forms a surface varied layer at the front surface of the layer made thereby; a thirty sixth step which deposits a protection film and a contact oxide film on the upper portion of the surface varied layer; a thirty seventh step which forms a photo-etching mask on the contact oxide film and exposes part of the surface varied layer by etching the protection film and the contact oxide film; a thirty eighth step which etches the remaining protection film which is remained after etching the protection film and the contact oxide film, the protection oxide film and the surface varied layer in order so as to expose a lower portion of the cap layer and at the same time to expose a lower portion of the source/drain region; and a thirty ninth step which coats a conductive material on the front surface of the layer made after forming the contact hole and forms a second conductive layer, so that the second conductive layer is connected to the source/drain region through the contact hole.

DETAILED DESCRIPTION OF THE INVENTION

FIGS. 3A through 3J show a semiconductor device so as to illustrate a semiconductor device fabrication process of a first embodiment according to the present invention.

Figure 3A:
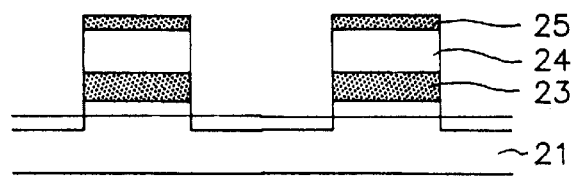
FIGS. 3A through 3J are cross-sectional views of a semiconductor device so as to show a fabrication process of the same according to a first embodiment according to the present invention.

As shown in FIG. 3A, an insulation material and a conductive material such as an impurity doped poly-crystal silicon are deposited on a semiconductor substrate 21 so as to form a gate insulation film and a gate electrode first conductive layer 23. In addition, one of a nitride, silicide and polyamide is deposited on the first cap layer 24 so as to form a second cap layer 25. Thereafter, a photo-resist is formed on the second cap layer 25, and a light exposure is conducted so as to form an etching mask. The gate insulation film, the first conductive layer 23, and the first and second cap layers 24 and 25 are etched.

An "n" type impurity is provided to the semiconductor substrate 21 with a mask of the gate insulation film, the first conductive layer 23, and the first and second cap layers 24 and 25 so as to form a lightly doped drain (LDD) structure.

Figure 3B:
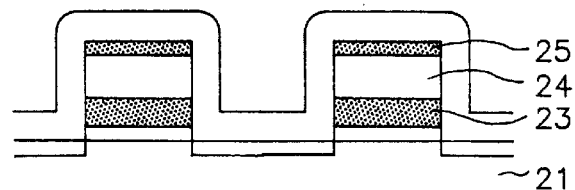
Figure 3C:
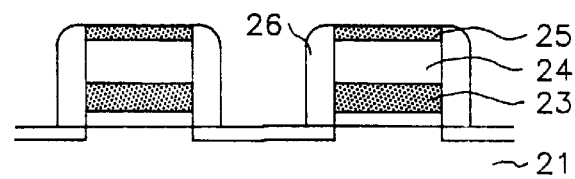
Figure 3D:
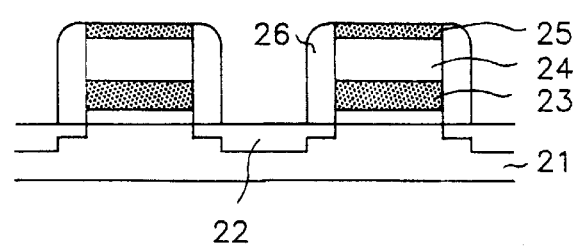

As shown in FIGS. 3B and 3C, an oxide film having a thickness of 1,000 Å through 1,500 Å is formed on the construction made after forming the LDD region using the low pressure chemical vapor deposition (LPCVD) method, and the construction is etched-back using a reactive ion etching (RIE) method thereafter so as to form a side wall spacer 26 at the gate insulation film, the first conductive layer 23, and the first and second cap layers 24 and 25. In addition, as shown in FIG. 3D, an "n" type impurity is ion-provided to the semiconductor substrate 21 so as to form the source/drain region 22. Here, this step can be omitted if necessary.

Figure 3E:
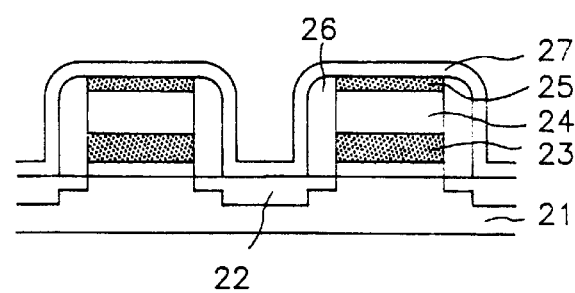
Figure 3F:
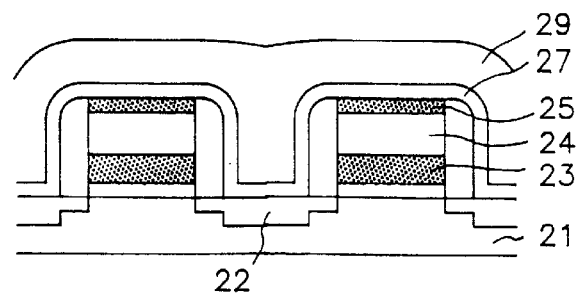

As shown in FIGS. 3E and 3F, a protection film 27 and a contact oxide film 29 are deposited on the front surface of the construction made after forming the above-mentioned source/drain region 22.

Here, the protection film 27 is formed by LPCVD using one of silicon and nitride to a thickness of 200 Å through 1,000 Å, and the contact oxide film 29 is deposited by LPCVD so as to deposit a boro-phosphor silicon glass. In another method, an oxide film in which an impurity is not doped and a deposition film of the BPSG are deposited to a thickness of 5,000 Å through 6,000 Å and are planarized by heat treatment at 2,900° C.

Figure 3G:
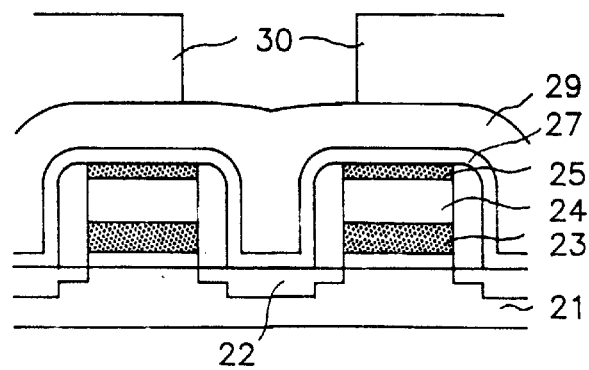
Figure 3H:
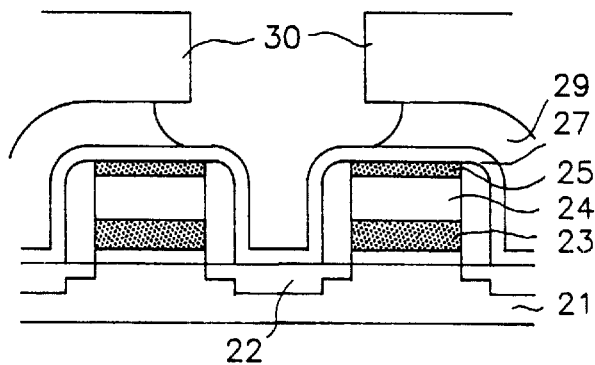

As shown in FIG. 3G, a photo-resist is formed on the contact oxide film 29, an etching mask 30 is formed so as to form a contact hole through a light exposure and a photographing, and as shown in FIG. 3H, the contact oxide film 29 is partially removed by the etchant containing an HF and the like.

Here, the protection film 27 acts as an etching stop layer because it has an etching selectivity with respect to the contact oxide film 29.

Figure 3I:
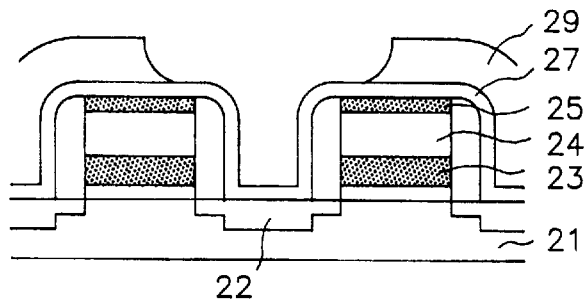
Figure 3J:
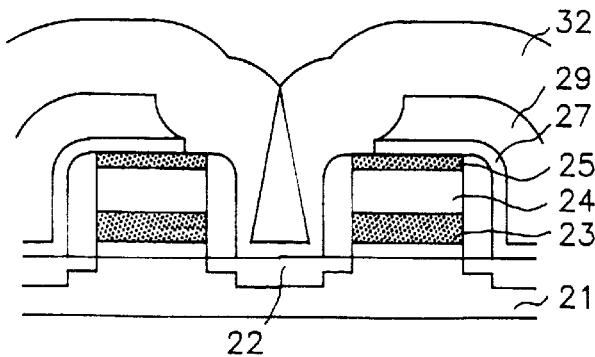

As shown in FIGS. 3I and 3J, the etching mask 30 is removed, and the protection film 27 is etched with a mask of the etched contact oxide film 29, and the poly-crystal silicon and $WSi_2$ are deposited in order at the front surface of the construction made after etching the protection film 27 so as to form a second conductive layer 32.

Here, the bit line second conductive layer is formed using a material having a high temperature melting point such as Tin, TiW and the like.

FIGS. 4A through 4J show a semiconductor device so as to illustrate a semiconductor device fabrication process of a second embodiment according to the present invention.

Here, since the fabrication processes of FIGS. 4A through 4I are the same as FIGS. 3A through 3I of the first embodiment according to the present invention, the same will be omitted. Only the fabrication processes corresponding to FIGS. 4I and 4J will be explained with reference to the accompanying drawings.

Figure 4A:
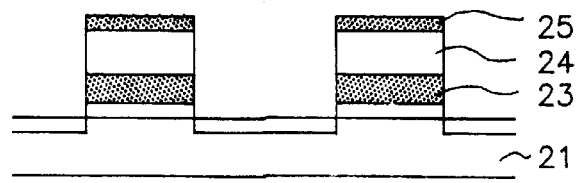
FIGS. 4A through 4J are cross-sectional views of a semiconductor device so as to show a fabrication process of the same of a second embodiment according to the present invention.
Figure 4B:
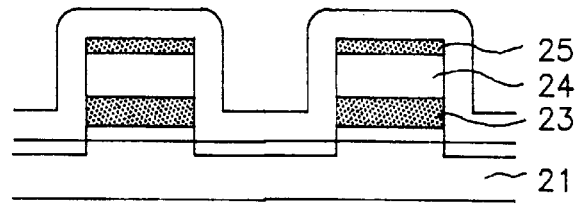
Figure 4C:
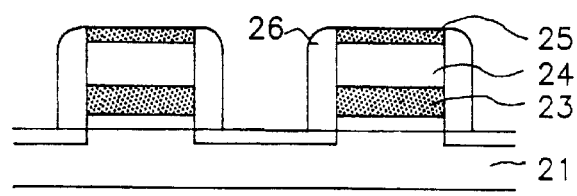
Figure 4D:
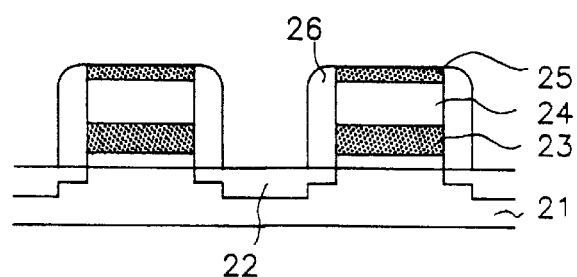
Figure 4E:
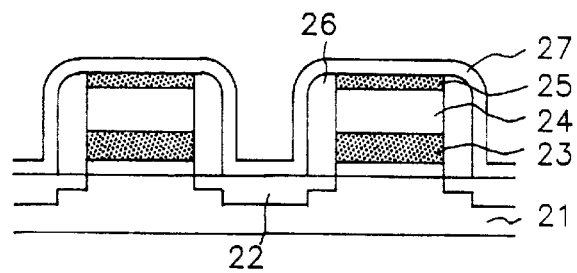
Figure 4F:
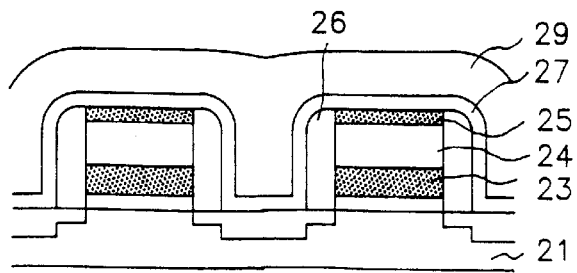
Figure 4G:
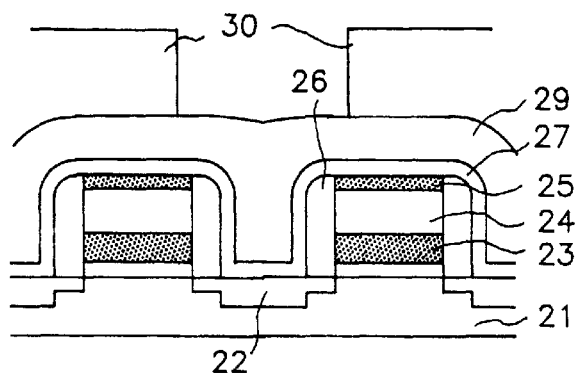
Figure 4H:
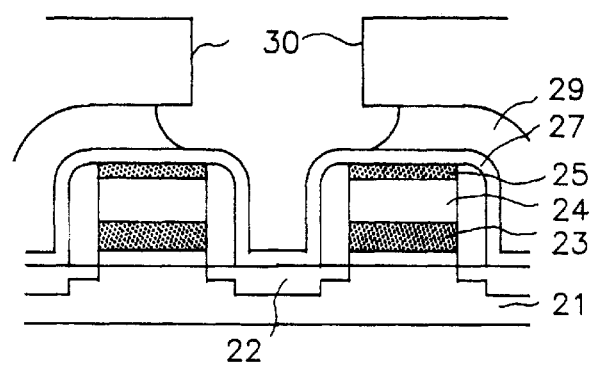
Figure 4I:
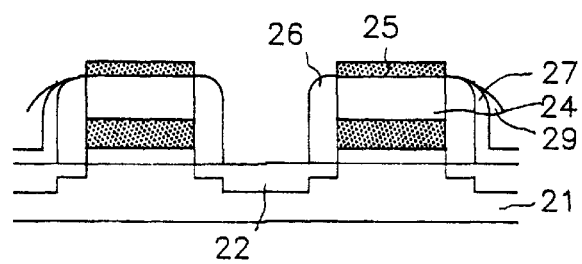
Figure 4J:
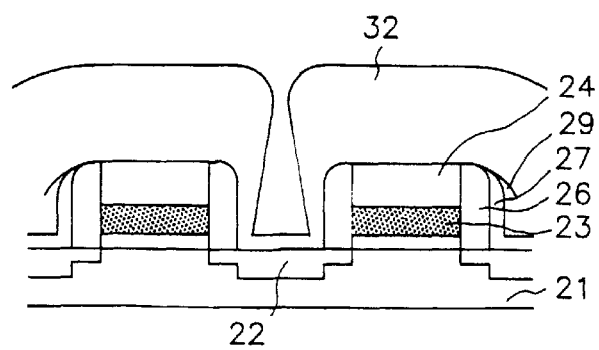
Figure 5A:
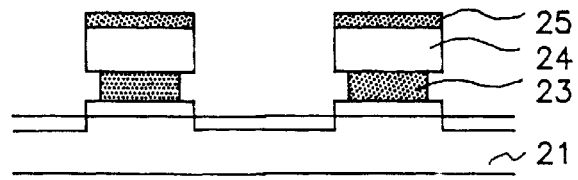
FIGS. 5A through 5J are cross-sectional views of a semiconductor device so as to show a fabrication process of the same of a third embodiment according to the present invention.
Figure 5B:
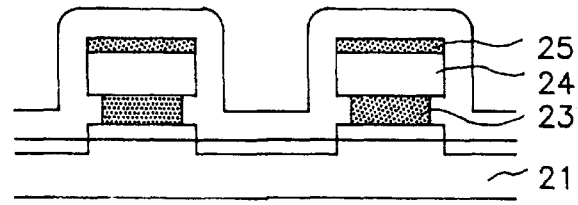
Figure 5C:
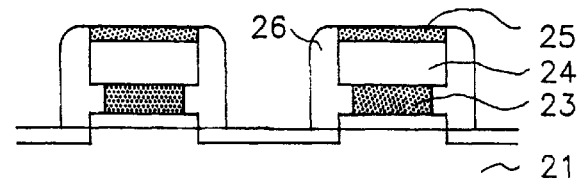
Figure 5D:
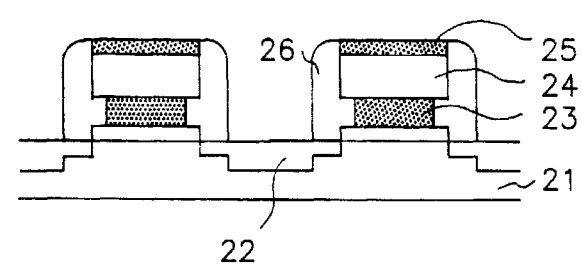
Figure 5E:
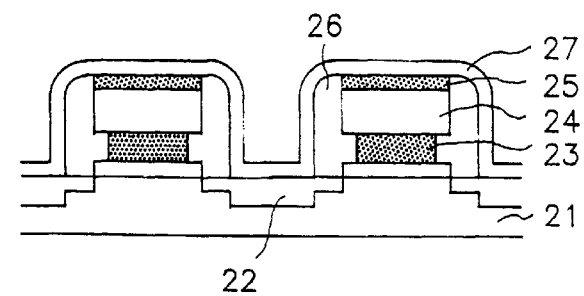
Figure 5F:
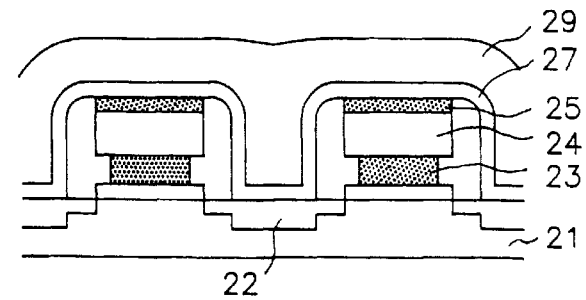
Figure 5G:
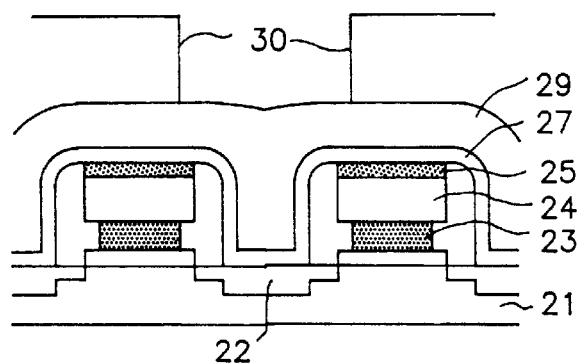
Figure 5H:
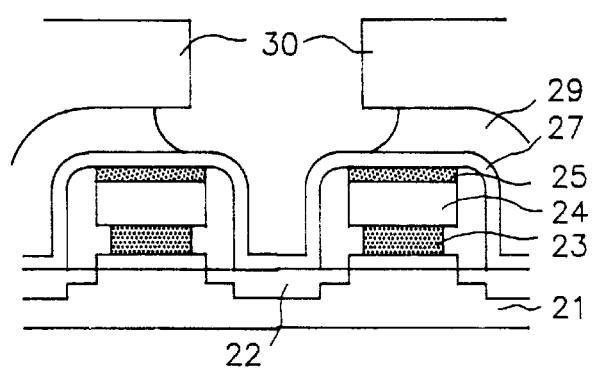
Figure 5I:
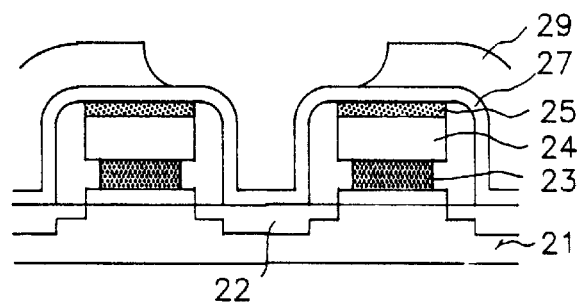
Figure 5J:
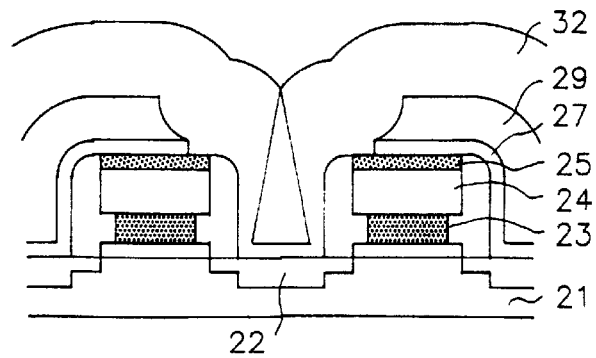
Figure 6A:
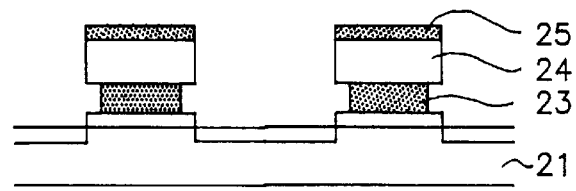
FIGS. 6A through 6J are cross-sectional views of a semiconductor device so as to show a fabrication process of the same of a fourth embodiment according to the present invention.
Figure 6B:
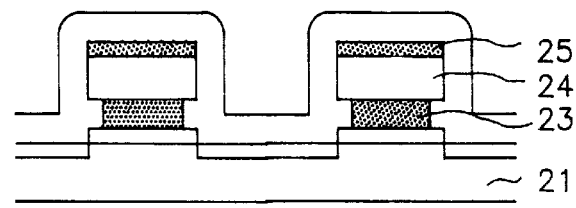
Figure 6C:
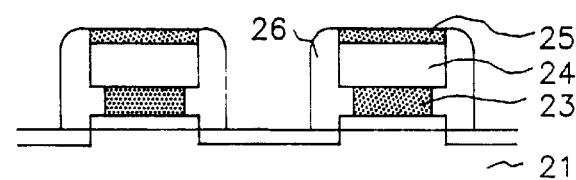
Figure 6D:
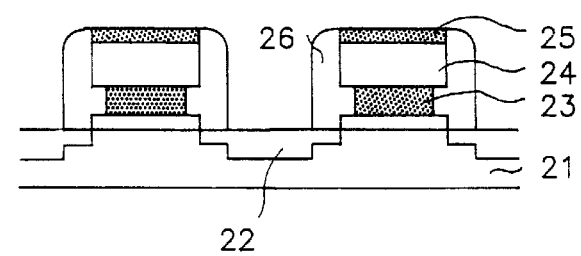
Figure 6E:
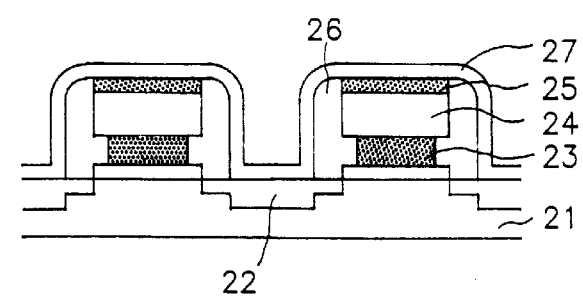
Figure 6F:
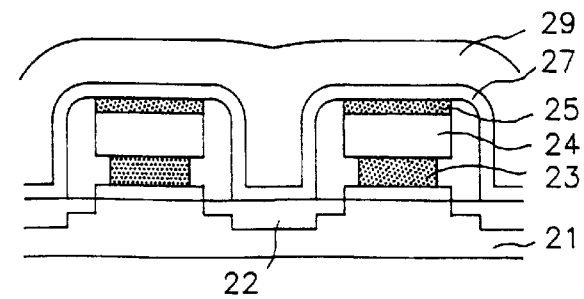
Figure 6G:
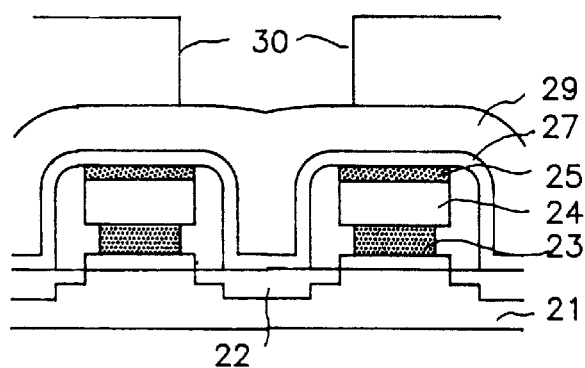
Figure 6H:
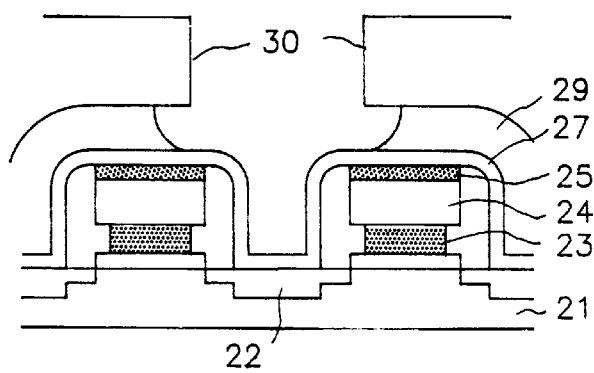
Figure 6I:
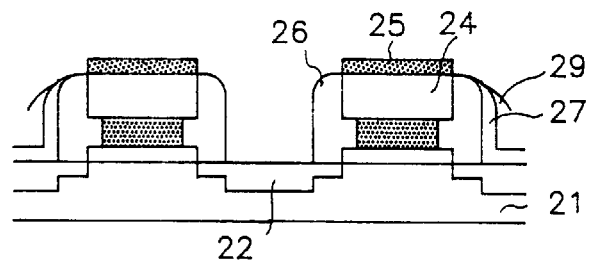
Figure 6J:
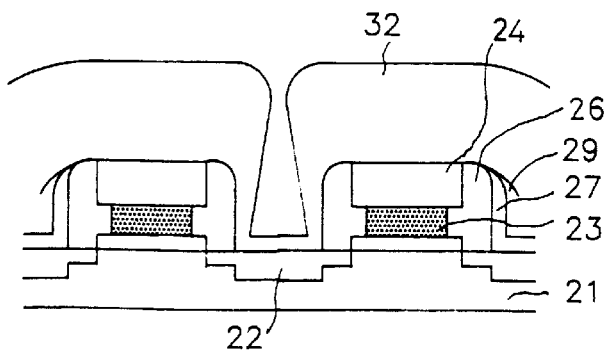

To begin with, as shown in FIGS. 4I and 4j, the etching mask 30 is removed, and the contact oxide film 29 and the protection film 27 are etched-back in order, and the sourceldrain region 22 between and the side wall spacers 26 is exposed, and the second cap layer is removed by one of the wet etching method and the dry etching method, and the poly-crystal silicon and $WSi_2$ are deposited thereon in order so as to form a bit line second conductive layer 32.

FIGS. 5A through 5J and 6A through 6J show a semiconductor device so as to illustrate a semiconductor device fabrication process of third and fourth embodiments, respectively, according to the present invention.

As shown therein, the third and fourth embodiment according to the present invention are directed to improving an isolation characteristic by forming a gate electrode that is recessed inwardly relative to an overlying gate cap oxide, and the first and second cap layer. The fabrication processes of FIGS. 5B through 5J are the same as FIGS. 3B through 3J except the process of forming a gate electrode, and the processes of FIGS. 6B through 6H are the same as FIGS. 4B–4H, the descriptions with respect thereto will be omitted. In this embodiment, the process of forming the gate electrode will now be explained with reference to FIG. 6A.

To begin with, a field oxide film is formed on the semiconductor substrate so as to define an active region and a non-active region, and a gate insulation film, a gate electrode first conductive layer 23, first and second cap layers 24 and 25 are deposited on the active region in order, and a photo-resist is doped on the second cap layer 25, and is exposed and photographed so as to form a etching mask, and the gate insulation film, the first conductive layer 23, and the first and second cap layers 24 and 25 are etched.

Here, the first conductive layer is etched together with the impurity-doped poly-crystal silicon layer, and the side wall thereof is isotropic-etched to have a thickness of 300 Å through 1,000 Å using a wet liquid containing $H_3Po_4$ or a chemical dry etching method using $CHF_3$ and $O_2$. The first cap layer 24 is formed to have an oxide film having a thickness of 1000 Å through 3000 Å, and the second cap layer 25 is formed with a nitride substance or a silicon substance having a thickness of 200 Å through 1000 Å.

Thereafter, an LDP region is formed by providing an "n"-type impurity on the semiconductor substrate 21 with a mask of the first and second cap layers 24 and 25.

FIGS. 7A through 7K show a semiconductor device so as to illustrate a semiconductor device fabrication process of a fifth embodiment according to the present invention, which is directed to forming a single film corresponding to the entire cap layers instead of the first and second cap layers, and more inwardly recessing the gate electrode rather than the cap layers same as the third embodiment, and to etching back a protection film.

Figure 7A:
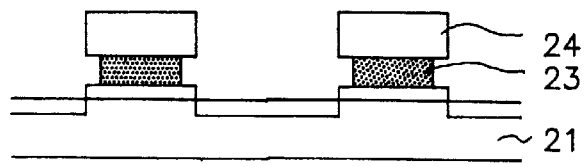
FIGS. 7A through 7K are cross-sectional views of a semiconductor device so as to show a fabrication process of the same of a fifth embodiment according to the present invention.
Figure 7B:
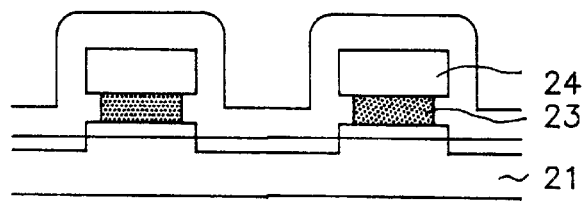
Figure 7C:
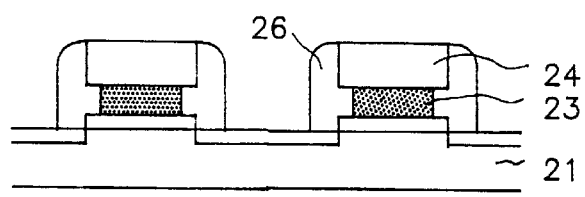
Figure 7D:
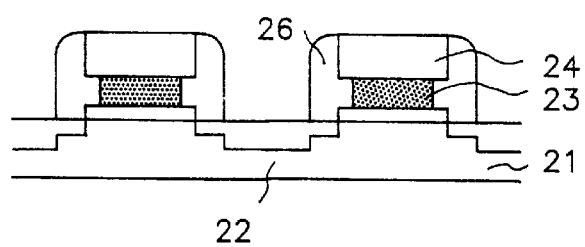
Figure 7E:
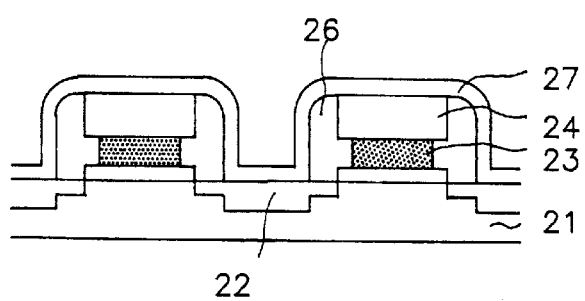
Figure 7F:
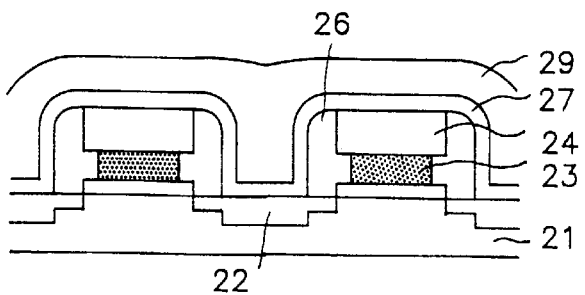
Figure 7G:
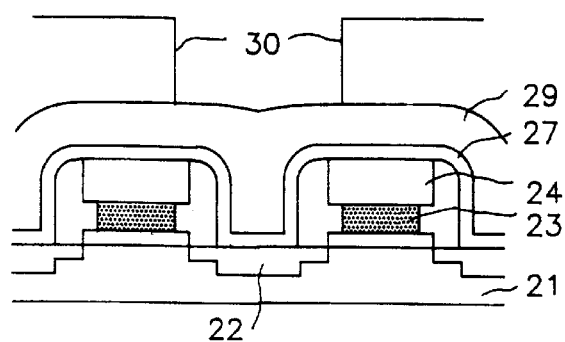
Figure 7H:
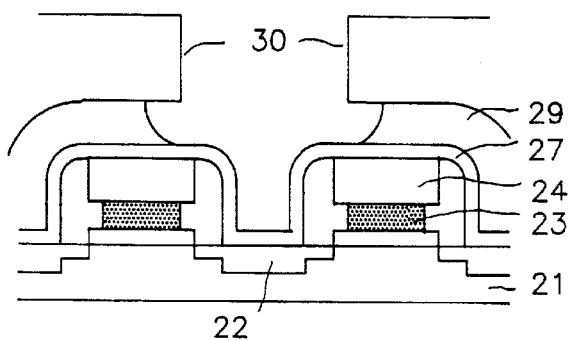

As shown in FIG. 7A, so as to define an active region and a non-active region on the semiconductor, a field oxide film is formed, and a gate insulation film is formed thereon by doping an insulation material on the active region to have a predetermined thickness, and a poly-crystal silicon on which an impurity is doped is doped on the gate insulation film so as to form a gate electrode first conductive layer 23, and an oxide is formed on the first conductive layer 23 to have a thickness 1,000 Å~3,000 Å so as to form a first cap layer 24, and the gate insulation film 3, the first conductive layer 23, and the first cap layer 24 are etched with an etching mask.

In addition, the side wall of the first conductive layer is isotropic-etched to have a thickness of 300 Å through 1,000 Å using a wet liquid containing $H_3PO_4$ or a chemical dry etching method using $CHF_3$ and $O_2$. Since the processes of FIGS. 7B through 7H are the same as the processes of FIGS. 1A through 1H, the descriptions with respect thereto will be omitted.

Figure 7I:
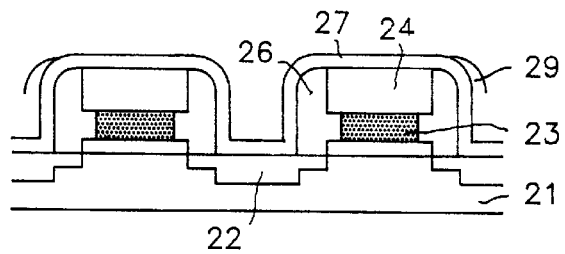
Figure 7J:
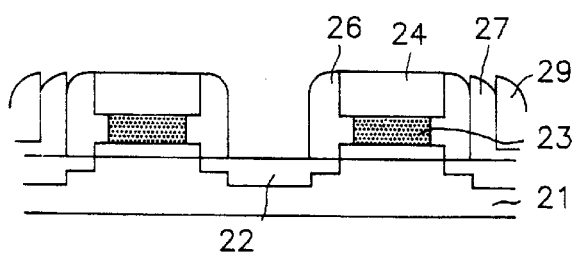

As shown in FIG. 7I, the etching mask 30 is removed in a dry and wet etching method, and the contact oxide film 29 is etched-back so as to expose the protection film 27, and as shown in FIG. 7J, the protection film 27 is etched-back again so as to expose a source/drain region between the side wall spacers 26, so that a contact hole is formed.

Figure 7K:
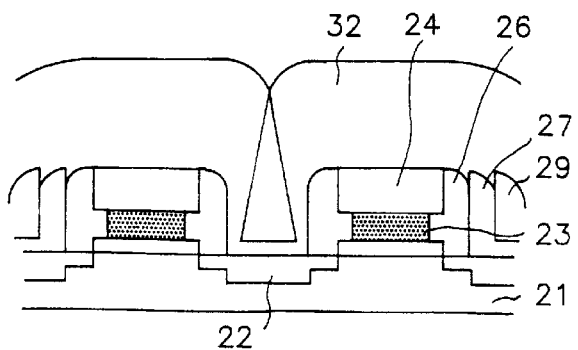

As shown in FIG. 7K, a poly-crystal silicon layer and a $WSi_2$ layer are deposited in order on the front surface of the construction made after forming the contact hole or a high temperature melting metal material such as TiN, adhesive material such as TiW, or tungsten is deposited thereon, and thereafter the thusly deposited construction is patterned, and a bit line second conductive layer 32 contacting with the source/drain region is formed in cooperation with the contact hole.

FIGS. 8A through 8K show a semiconductor device so as to illustrate a semiconductor device fabrication process of a sixth embodiment according to the present invention, which is directed to forming a single cap layer of an oxide film, nitride film instead of the oxide film, or polyamide as done in the fifth embodiment, and is directed to more inwardly recessing the gate electrode rather than the cap layer.

Figure 8A:
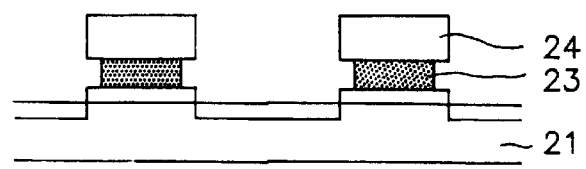
FIGS. 8A through 8K are cross-sectional views of a semiconductor device so as to show a fabrication process of the same of a sixth embodiment according to the present invention.

That is, as shown in FIG. 8A, a field oxide film is formed on the semiconductor substrate so as to define an active region and a non-active region, and an insulation material is coated on the active region to have a predetermined thickness, a poly-crystal silicon on which an impurity is doped is coated on the gate insulation film so as to form a first conductive layer 23, and either a nitride film or a polyamide is deposited thereon to have a thickness of 1,000 Å~3,000 Å so as to form a first cap layer 24, and the gate insulation film, the first conductive layer 23, and the first cap layer 24 are etched.

Figure 8B:
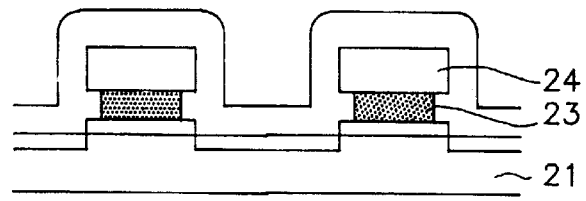
Figure 8C:
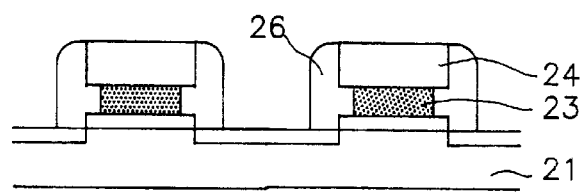
Figure 8D:
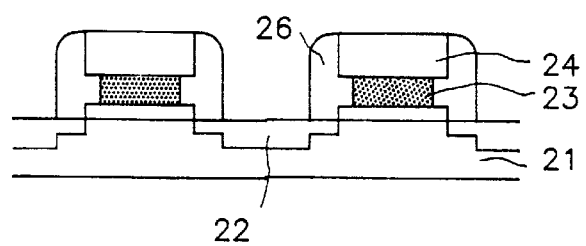

In addition, the side wall of the first conductive layer is isotropic-etched to have a thickness of 300 Å through 1,000 Å using a wet liquid containing $H_3PO_4$ or a chemical dry etching method using $CHF_3$ and $O_2$. Since the processes of FIGS. 8B through 8D are the same as the processes of FIGS. 1B through 1D, the descriptions with respect thereto will be omitted.

Figure 8E:
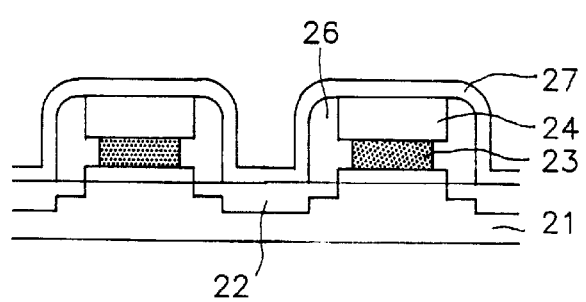
Figure 8F:
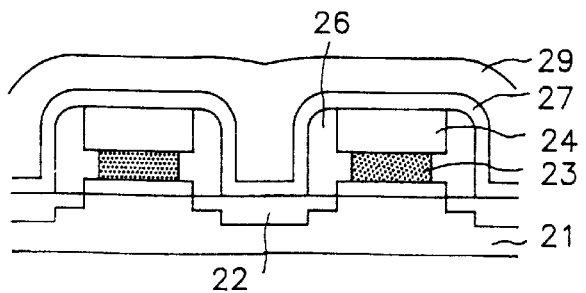

As shown in FIGS. 8E and 8F, an oxide film 27 is formed on the front surface of the construction made after forming the source/drain region to have a predetermined thickness. A glass which is not doped is coated on the oxide film 27 to have a thickness of 1,000 Å~3,000 Å, and a BPSG on which an impurity is not doped is deposited thereon to have a thickness of 5,000 Å~6,000 Å and heat-treated at over 2,900° C. so as to form contact oxide film 29 having a quality flatness.

Figure 8G:
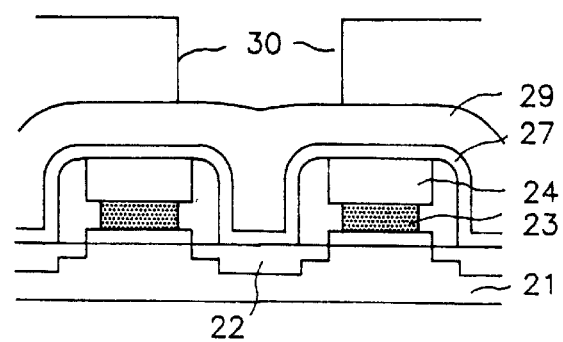
Figure 8H:
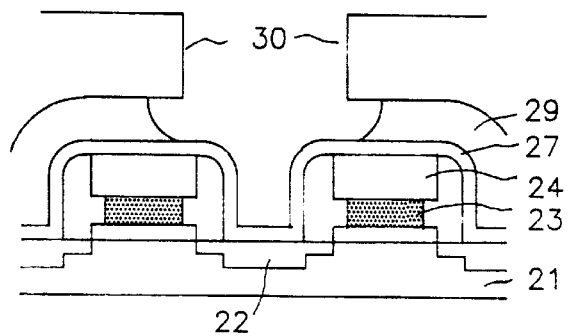
Figure 8I:
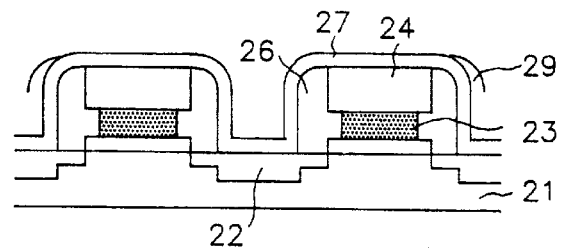
Figure 8J:
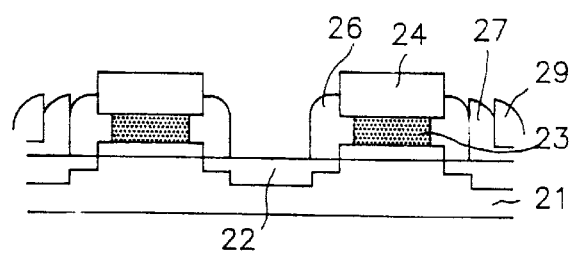
Figure 8K:
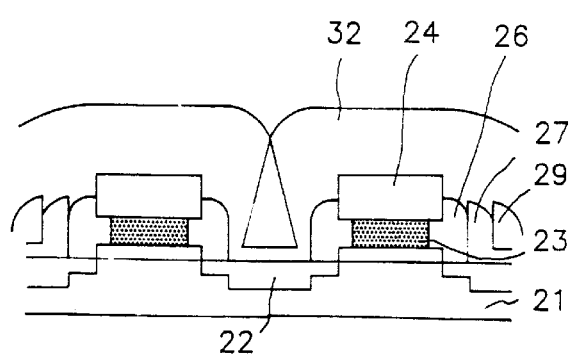

As shown in FIG. 8G, a photo-resist is coated on the contact oxide film 29 and light-exposed, and photographed same as FIG. 4G, and the contact oxide film 29 is isotropic-etched so as to expose the oxide film 28 at the lower portion thereof, and as shown in FIGS. 8I and 8J, the etching mask is removed, and the contact oxide film 29 and the oxide film 28 are etched-back so as to expose the upper region of the first cap layer 24 and a source/drain region, so that a contact hole is formed, and as shown in FIG. 8K, after forming the contact hole, a poly-crystal silicon and $WSi_2$ are deposited or an adhesive such as a TiN or TiW or a high temperature melting material such as tungsten is deposited thereon and patterned, and a bit line second conductive layer 32 contacting with the source/drain region is formed in cooperation with the contact hole.

FIGS. 9A through 9J show a semiconductor device so as to illustrate a semiconductor device fabrication process of a seventh embodiment according to the present invention, which is directed to forming a single cap layer of an oxide film same as the fifth embodiment. The side wall of the gate electrode is not etched, and the protection film is not etched-back.

Figure 9A:
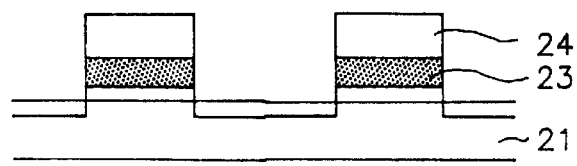
FIGS. 9A through 9J are cross-sectional views of a semiconductor device so as to show a fabrication process of the same of a seventh embodiment according to the present invention.
Figure 9B:
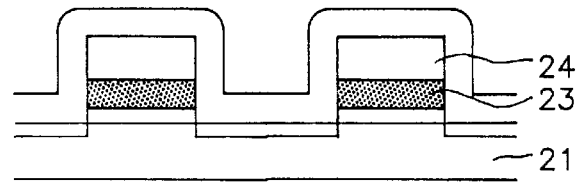
Figure 9C:
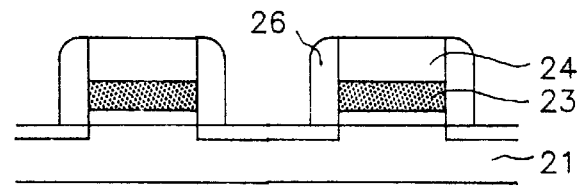
Figure 9D:
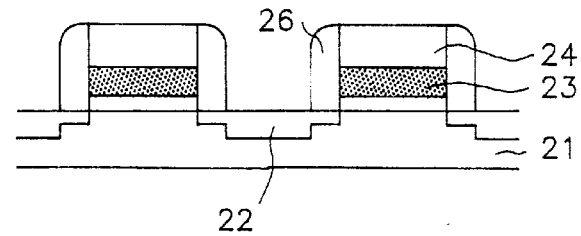

As shown in FIG. 9A, a field oxide film is formed on the semiconductor substrate so as to define an active region and a non-active region, and an insulation material is coated on the active region to have a predetermined thickness so as to form a gate insulation film, and a poly-crystal silicon on which an impurity is doped is coated on the gate insulation film so as to form a gate electrode first conductive layer 23, and an oxide film is deposited thereon so as to form a first cap layer 24, and the gate insulation film, the first conductive layer, and the first cap layer 24 are etched. Since the processes of FIGS. 9B through 9J are the same as FIGS. 4B through 4J, the descriptions with respect thereto will be omitted.

FIGS. 10A through 10K show a semiconductor device so as to illustrate a semiconductor device fabrication process of an eighth embodiment according to the present invention, which is directed to forming a single cap layer of an oxide film same as the fifth embodiment. The side wall of the gate electrode is not etched, and the protection film is etched-back.

Figure 1:
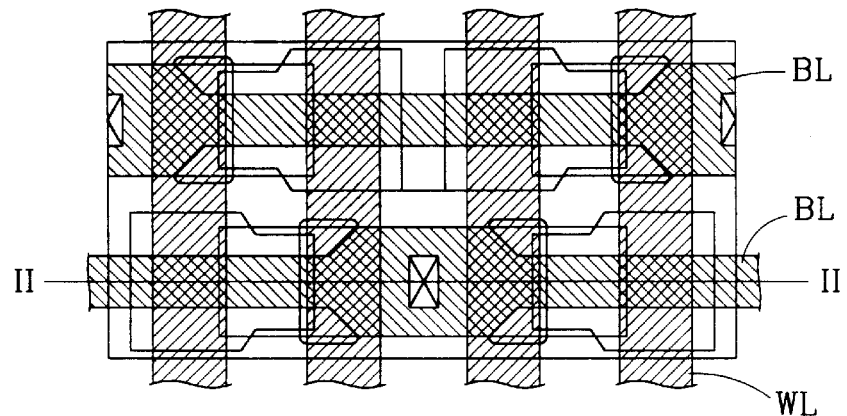
FIG. 1 is a top view of a conventional stack type capacitor.
Figure 2:
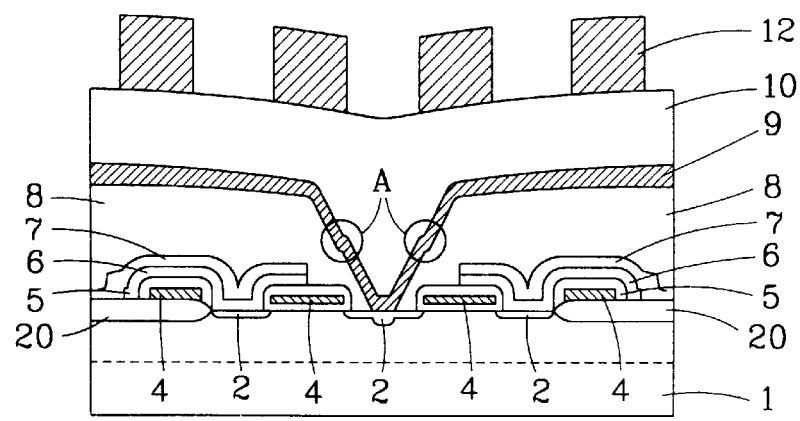
FIG. 2 is a cross-sectional view taken along line II—II of FIG. 1.
Figure 10A:
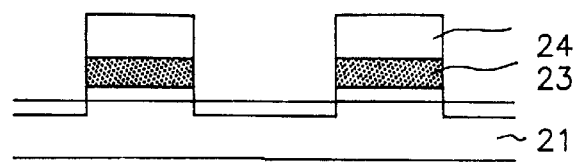
FIGS. 10A through 10K are cross-sectional views of a semiconductor device so as to show a fabrication process of the same of an eighth embodiment according to the present invention.

Since the process of FIG. 10A is the same as FIG. 1A, and the processed of FIGS. 10B through 10H are the same as FIGS. 1B through 1H, the descriptions with respect thereto will be omitted.

Figure 10B:
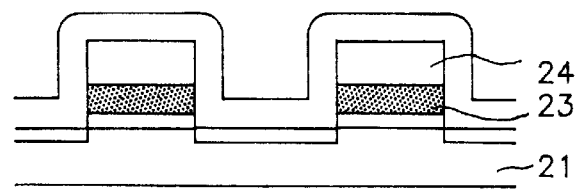
Figure 10C:
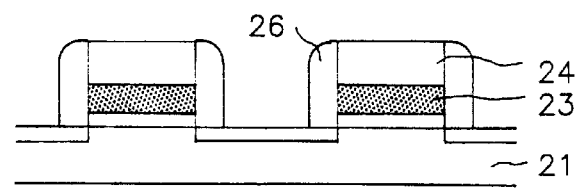
Figure 10D:
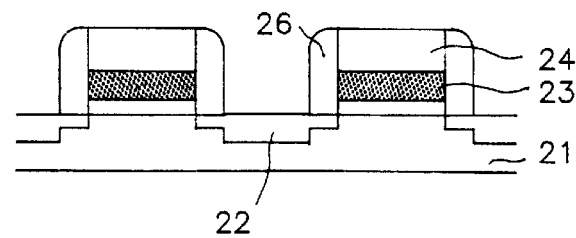
Figure 10E:
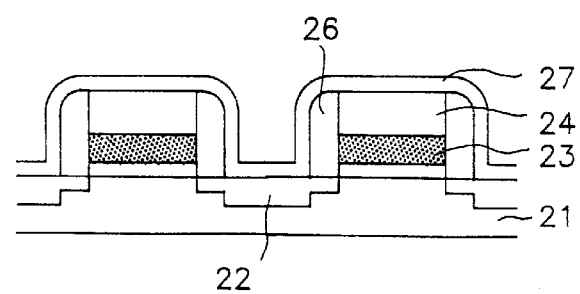
Figure 10F:
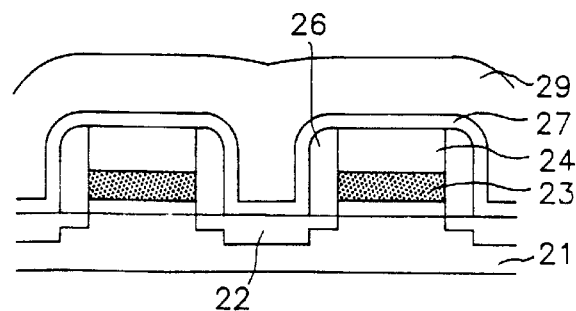
Figure 10G:
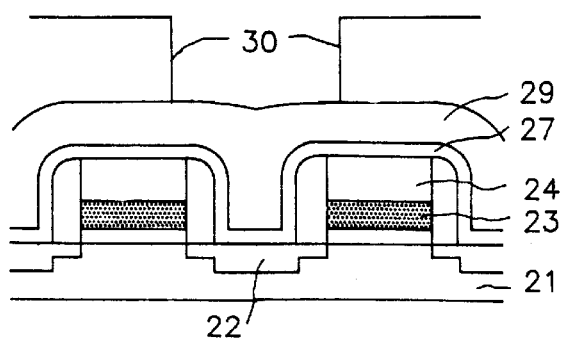
Figure 10H:
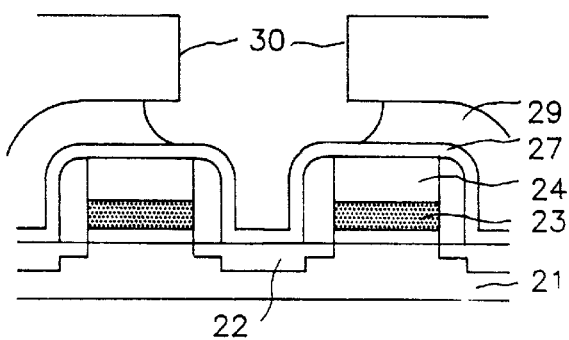
Figure 10I:
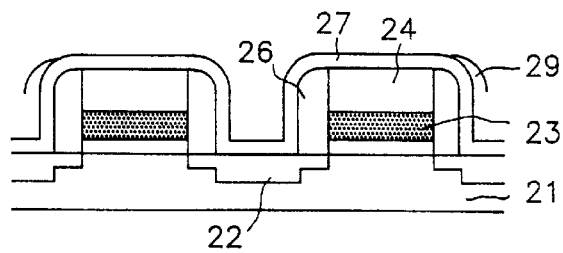
Figure 10J:
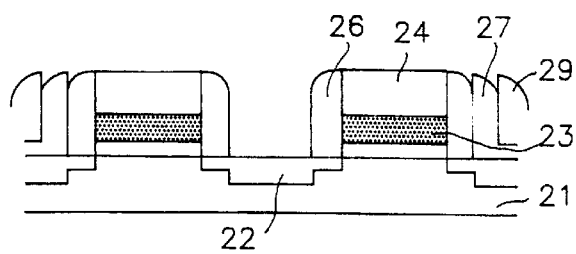
Figure 10K:
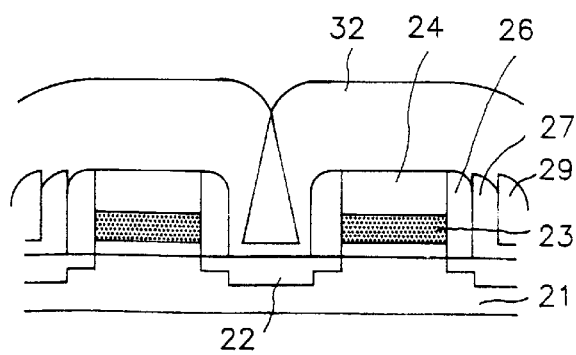

As shown in FIG. 10I, the etching mask is removed in the dry and wet etching method, and the contact oxide film 29 is etched-back so as to expose the protection film 27, and as shown in FIG. 10J, the protection film 27 is etched-back so as to expose the source/drain region between the protection film 27 and the side wall spacer 26, so that a contact hole is formed, and as shown in FIG. 10K, a bit line second conductive layer contacting with the source/drain region is formed in cooperation with the contact hole.

FIGS. 11A through 11K show a semiconductor device so as to illustrate a semiconductor device fabrication process of a ninth embodiment according to the present invention, which is directed to applying a nitride or silicate the surface of the first cap layer 24 formed with an oxide film of the upper surface of the side wall spacer and the gate electrode so as to protect the thusly varied portion.

Figure 11A:
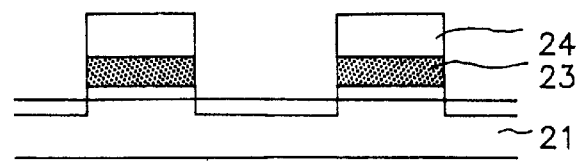
FIGS. 11A through 11J are cross-sectional views of a semiconductor device so as to show a fabrication process of the same of a ninth embodiment according to the present invention.
Figure 11B:
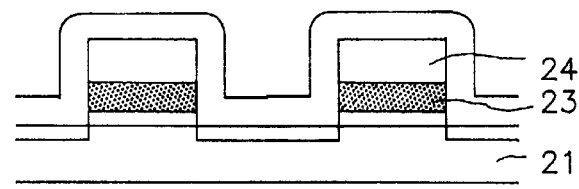
Figure 11C:
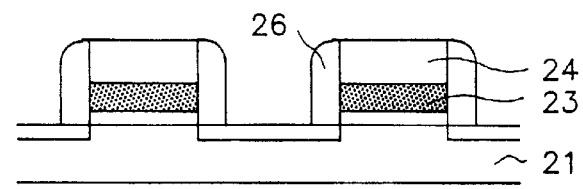

Since the processes of FIGS. 11A through 11C are the same as the processes of FIGS. 10A through 10C, the descriptions with respect thereto will be omitted.

Figure 11D:
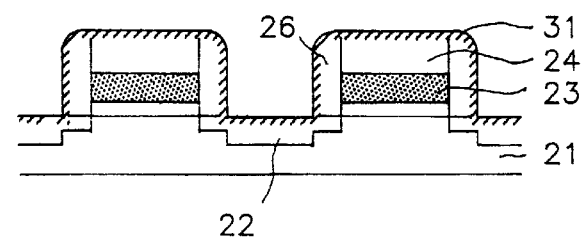

The above-mentioned nitride process is directed to fast heat-treating the surface of the first cap layer 24 of an oxide film and the side wall spacer 26 as shown in FIG. 11D under an environment of either $NH_3$ or $N_2$.

Here, a plasma processing may be adopted instead of the above-mentioned high temperature heat treatment.

In addition, the above-mentioned silicate process can be heat-treated at a high temperature under either $SiH_4$ or $SiH_2Cl_2$. Here, it is also possible to adopt a plasma process instead of the high temperature heat treatment. The thusly made nitride and silicate portions of the surface varying layer 31 have a quality oxide film and a good etching selectivity.

Here, the above-mentioned silicate process is directed to a high temperature and high speed heat treatment under either $SiH_4$ and $SiH_2Cl_2$. Here, the plasma treatment can be adopted instead of the high temperature and high speed heat treatment. As a result, the thusly made nitride or silicate portion of the surface varied layer 31 becomes a surface varied layer 31 different from the oxide film in their etching selectivity.

Here, the surface of the source/drain region is nitrided or silicate, and in another method of forming the surface varied layer 31, a source containing "N" is provided in a nitride process for an ion introduction, and a source containing "Si" is provided in a silicate process for an ion introduction.

Figure 9E:
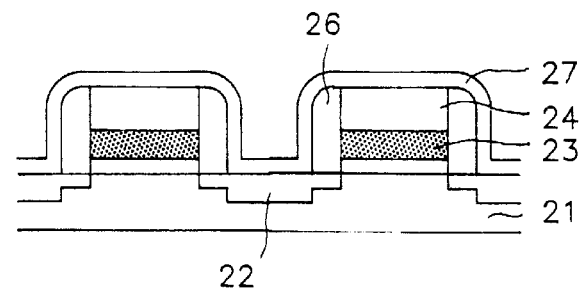
Figure 9F:
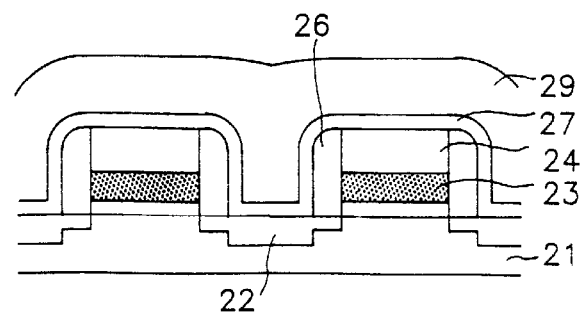
Figure 9G:
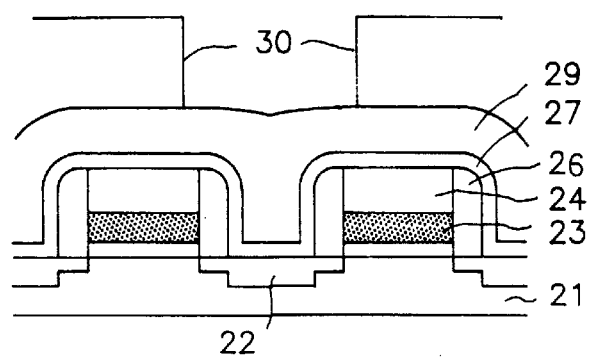
Figure 9H:
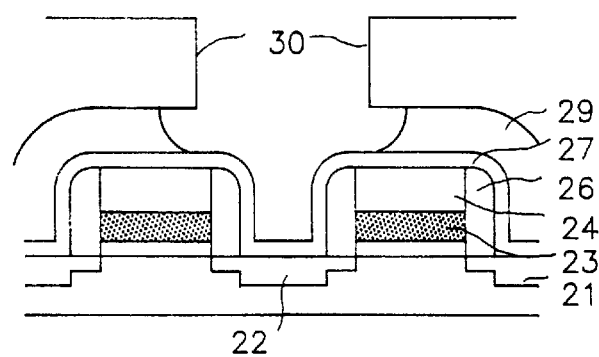
Figure 9I:
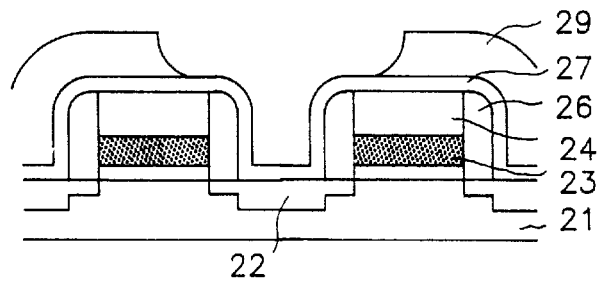
Figure 9J:
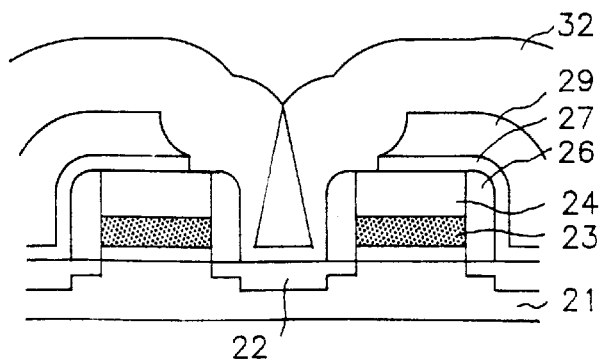
Figure 11E:
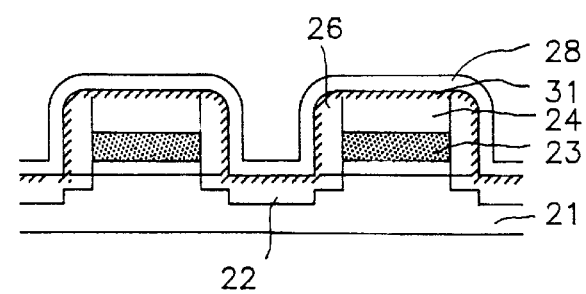
Figure 11F:
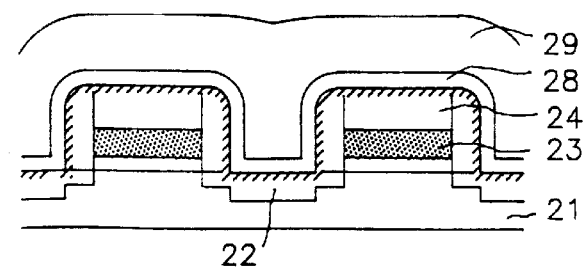

FIGS. 11E and 11F show a semiconductor device so as to illustrate a semiconductor device fabrication process, which is directed to forming an oxide film 28 having a predetermined thickness on the front surface after forming a source/drain region in the same method as FIGS. 9E and 9F, and the glass which is not doped is coated to have a thickness of 1,000 Å~3,000 Å, and BPSG on which an impurity is not doped is deposited to have a thickness of 5,000 Å~6,000 Å and heat-treated at over 2,900° C. under an environment in which oxygen is provided, so that a quality contact oxide film 29 having a good flatness is formed.

Figure 11G:
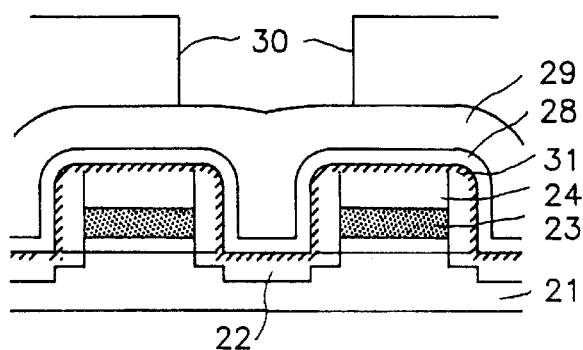
Figure 11H:
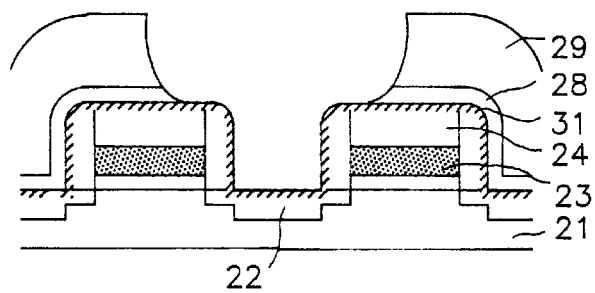

FIGS. 11G and 11H show a semiconductor device so as to illustrate a semiconductor device fabrication process, which is directed to forming an etching mask 30 on the contact oxide film 29 and isotropic-etching the contact oxide film 29 and the oxide film 28 so as to expose part of the surface varied layer 31 and expose the etching mask 30.

Figure 11I:
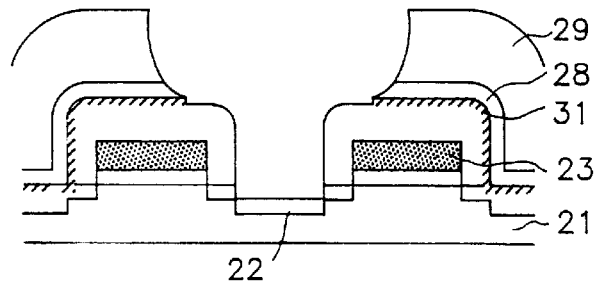
Figure 11J:
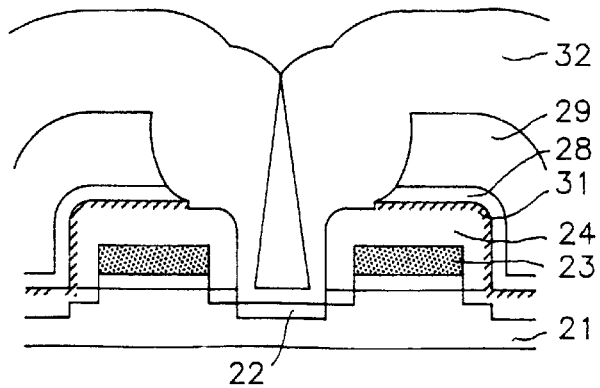

As shown in FIGS. 11I and 11J, the exposed portion of the surface varied layer 31 is selectively etched with a mask of the etched contact oxide film 29 and the oxide film 28. Here, the upper surface of the nitride source/drain region or the silyated region are also etched, and a bit line second conductive layer contacting with the upper surface-etched source/drain region is formed.

FIGS. 12A through 12J show a semiconductor device so as to illustrate a semiconductor device fabrication process, which is directed to nitriding or silicate the side wall spacer and the surface of the first cap layer of the oxide film of the gate electrode and etching-back the protection film and the thusly made silicate or nitride surface.

Since the processes of FIGS. 12A through 12G are the same as FIGS. 11A through 11G, the descriptions with respect thereto will be omitted.

Figure 12A:
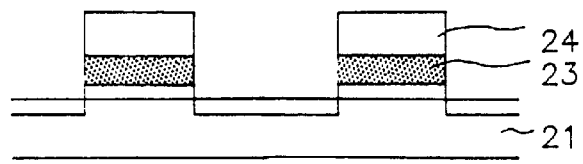
FIGS. 12A through 12J are cross-sectional views of a semiconductor device so as to show a fabrication process of the same of a tenth embodiment according to the present invention.
Figure 12B:
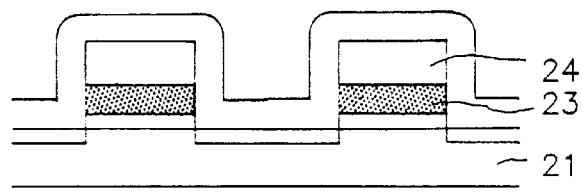
Figure 12C:
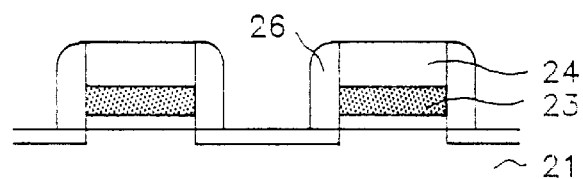
Figure 12D:
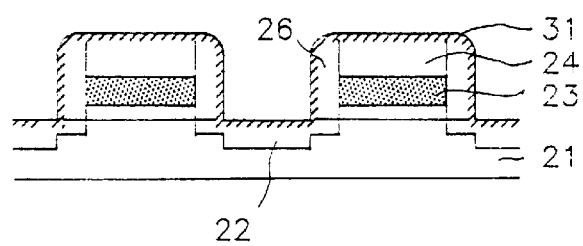
Figure 12E:
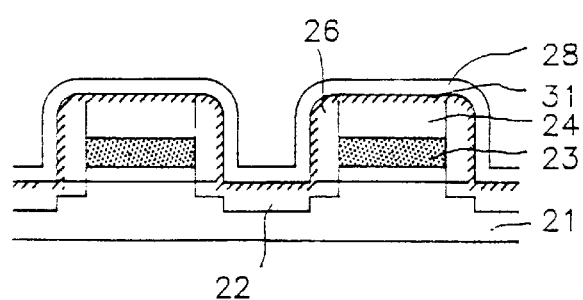
Figure 12F:
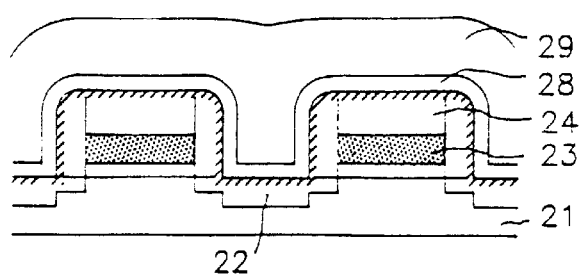
Figure 12G:
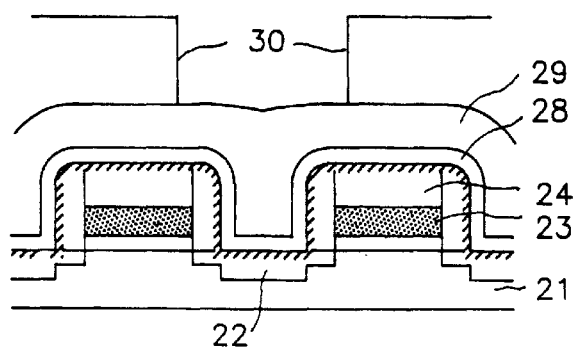
Figure 12H:
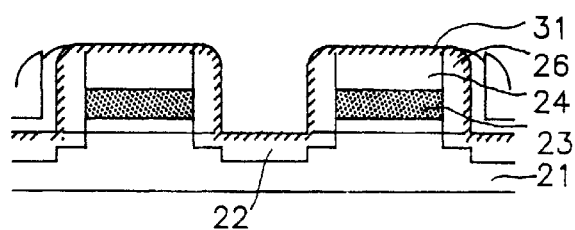
Figure 12I:
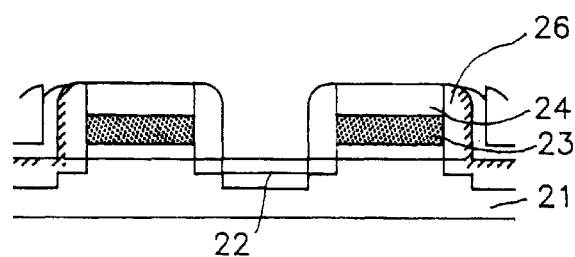
Figure 12J:
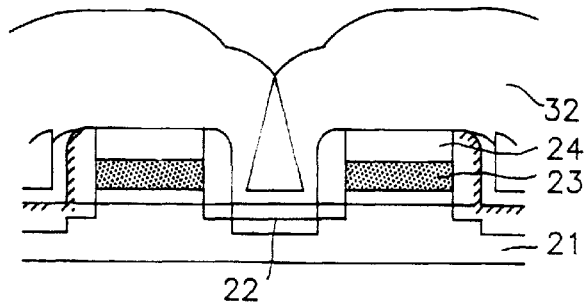

The process as shown in FIG. 12H is directed to removing the etching mask 30, etching-back the contact oxide film 29 and the oxide film 28 in order, and selectively exposing part of the surface varied layer, and as shown in FIGS. 12I and 12J, the exposed portion of the surface varied layer 31 and the nitride and silyated upper surface of the source/drain region are etched. Thereafter, the bit line second conductive layer 32 contacting with the source/drain region is formed.

As described above, the semiconductor device fabrication method is directed to forming a cap layer on the upper portion of the gate electrode, forming a side wall spacer at the side surface of the cap layer, and forming a bit line second conductive layer in a magnetic alignment method, so that an insulation characteristic can be improved.

What is claimed is:

1. A semiconductor device fabrication method, comprising the steps of:

a first step which coats a conductive material on an active region of a semiconductor substrate having said active region and a non-active region divided by a field oxide film and forms a first conductive layer;

a second step which forms a first cap layer and a second cap layer in order on said first conductive layer and selectively etches the second cap layer, the first cap layer and the first conductive layer;

a third step which puts ions into said semiconductor substrate using a mask comprised of the first conductive layer, the first cap layer, and the second cap layer and forms a source/drain region;

a fourth step which forms side wall spacers at the side surfaces of the first conductive layer, said first cap layer and said second cap layer and deposits in order a protection film and a contact oxide film on exposed surfaces;

a fifth step which forms a photo-etching mask on the contact oxide film, etches said protection film and contact oxide film so as to expose said source/drain region of said substrate, so that a contact hole is formed; and a sixth step which coats a conductive material on exposed surfaces to form a second conductive layer contacting with the source/drain region in cooperation with the contact hole.

2. The method of claim 1, wherein said second step includes a step which etches the first conductive layer, the first cap layer, and the second cap layer to a predetermined width and so exposes side walls thereof, respectively.

3. The method of claim 2, wherein said step of etching includes a wet etching process using $H_3PO_4$.

4. The method of claim 2, wherein said step of etching includes a chemical dry etching process.

5. The method of claim 1, wherein a thickness of the first conductive layer is about 300 Å~1000 Å.

6. The method of claim 1, wherein said first cap layer is one of a nitride film, polyamide and a silicon film.

7. The method of claim 1, wherein said fourth step includes a step of forming an oxide film on exposed surfaces and a step of reactive-ion-etching the oxide film.

8. The method of claim 1, wherein said protection film is one of a nitride film, polyamide and a silicon film.

9. The method of claim 1, wherein said fourth step includes in order a step which deposits and heat-treats a glass on which an impurity is not doped and a glass on which an impurity is doped.

10. The method of claim 1, wherein said fifth step includes a step which forms a mask on the contact oxide film, another step which uses the mask to etch the contact oxide film, and still another step which exposes the upper portion of the second cap layer and the source/drain region by partially etching the protection film with the etched contact oxide film as a mask.

11. The method of claim 1, wherein said second step includes undercuts said first cap layer such that each end of said first cap layer extends beyond a corresponding end of said first conductive layer.

12. A semiconductor device fabrication method, comprising the steps of:
- a first step which coats a conductive material on an active region of a semiconductor substrate divided into said active region and a non-active region by a field oxide film and forms a conductive layer;
- a second step which forms a cap layer on said first conductive layer and selectively etches the first conductive layer and the cap layer;
- a third step which puts ions into the semiconductor substrate using a mask comprised of the first conductive layer and the cap layer and forms a source/drain region;
- a fourth step which forms side wall spacers at the side wall of the etched first conductive layer and the cap layer and deposits in order a protection film and a contact oxide film on exposed surfaces;
- a fifth step which forms a photo-etching mask on the contact oxide film and exposes part of the protection film by etching the contact oxide film;
- a sixth step which selectively etches back the remaining contact oxide film and the protection film, exposes the upper portion of the cap layer, and at the same time forms a contact hole by exposing said source/drain region; and
- a seventh step which coats a conductive material on exposed surfaces to form a second conductive layer contacting with a source/drain region in cooperation with the contact hole.

13. The method of claim 12, wherein said cap layer is one of an oxide film, a nitride film and a silicon film.

14. The method of claim 12, wherein said second step includes undercuts said cap layer such that each end of said cap layer extends beyond a corresponding end of said first conductive layer.

15. A semiconductor device fabrication method, comprising the steps of:
- a first step which coats a conductive material on an active region of a semiconductor substrate which is divided into [an] said active region and a non-active region by a field oxide film and forms a first conductive layer;
- a second step which forms in order a first cap layer and a second cap layer on said first conductive layer and selectively etches the second cap layer, the first cap layer and the first conductive layer;
- a third step which puts ions into said semiconductor substrate using a mask comprised of the first conductive layer, the first cap layer and the second cap layer and forms a source/drain region;
- a fourth step which forms side wall spacers of the etched first conductive layer, the first cap layer and the second cap layer and deposits a protection layer and a contact oxide film on exposed surfaces;
- a fifth step which forms a photo-etching mask on the contact oxide film and etches the protection film and the contact oxide film so as to expose said source/drain region of the substrate;
- a sixth step which selectively etches back the remaining contact oxide film, the protection film and an upper portion of the side wall spacers and exposes the second cap layer and at the same time exposes the source/drain region so as to form a contact hole; and
- an eighth step which coats a conductive material on exposed surfaces to form a second conductive layer connected to the source/drain region through a contact hole.

16. The method of claim 15, wherein said second step includes undercuts said first cap layer such that each end of said first cap layer extends beyond a corresponding end of said first conductive layer.

17. A semiconductor device fabrication method, comprising the steps of:
- a first step which coats a conductive material on an active region of a semiconductor substrate which is divided into said active region and a non-active region by a field oxide film and forms a first conductive layer;
- a second step which forms a cap layer on said first conductive layer and selectively etches the first conductive layer and the cap layer;
- a third step which puts ions into said semiconductor substrate using a mask comprised of the first conductive layer and the cap layer and forms a source/drain region;
- a fourth step which forms side wall spacers at the side surfaces of the first conductive layer and the cap layer and forms a surface-varied layer on exposed surfaces of the cap layer, the side wall spacers and the substrate;
- a fifth step which deposits in order a protection film and a contact oxide film on said surface-varied layer;
- a sixth step which forms a photo-etching mask on the contact oxide film and etches the protection film and the contact oxide film so as to expose said surface-varied layer;
- a seventh step which etches part of the surface-varied layer to expose a lower source/drain region, and forms a contact hole; and
- an eighth step which coats a conductive material on exposed surfaces to form a second conductive layer connected to the source/drain region through the contact hole.

18. The method of claim 17, wherein said fourth step includes a nitride step to form said surface-varied layer.

19. The method of claim 18, wherein said nitride step includes a high temperature heat-treatment step under an $NH_3$ environment.

20. The method of claim 19, wherein said fourth step further includes a high temperature heat-treatment step under an $SiH_4$ environment.

21. The method of claim 19, wherein said fourth step further includes a plasma-treatment step under a $SiH_4$ environment.

22. The method of claim 19, wherein said fourth step further includes a high temperature heat-treatment step under an $SiH_2Cl_2$ environment.

23. The method of claim 19, wherein said fourth step further includes a plasma-treatment step under an $SiH_2Cl_2$ environment.

24. The method of claim 19, wherein said fourth step further includes a step which provides a source containing a silicon to the front surface of the layer made after forming the side wall spacer in an ion insertion method.

25. The method of claim 18, wherein said nitride step includes a plasma-treatment step under an NH3 environment.

26. The method of claim 18, wherein nitride step includes a high temperature heat-treatment step under an $N_2$ environment.

27. The method of claim 18, wherein said nitride step includes a plasma-treatment step under a $N_2$ environment.

28. The method of claim 18, wherein said nitride step further includes a step which provides a source containing nitrogen to the front surface of the layer formed after forming the side wall spacer in an ion insertion method.

29. The method of claim 17, wherein said fourth step includes a silicate step to form said surface-varied layer.

30. The method of claim 17, wherein said second step includes undercuts said cap, layer such that each end of said cap layer extends beyond a corresponding end of said first conductive layer.

31. A semiconductor device fabrication method, comprising the steps of:

a first step which coats a conductive material on an active region of a semiconductor divided into said active region and a non-active region by a field oxide film and forms a first conductive layer;

a second step which forms a cap layer on said first conductive layer and selectively etches the first conductive layer and said cap layer;

a third step which forms a source/drain region by putting ions into the semiconductor substrate using a mask comprised of the first conductive layer and the cap layer;

a fourth step which forms side wall spacers at the side surfaces of the first conductive layer and the cap layer and forms a surface-varied layer on exposed surfaces of the cap layer, the side wall spacers and the substrate;

a fifth step which deposits in order a protection film and a contact oxide film on the surface-varied layer;

a sixth step which forms a photo-etching mask on the contact oxide film and exposes part of said surface-varied layer by selectively etching the protection film and the contact oxide film using the mask;

a seventh step which etches the remaining contact oxide film, the protection film and the surface-varied layer so as to expose an upper portion of the cap layer and at the same time forms a contact hole that exposes a portion of the source/drain region; and an eighth step which coats a conductive material on exposed surfaces to form a second conductive layer connected to the source/drain region through the contact hole.

32. The method of claim 31, wherein said second step includes undercuts said cap layer such that each end of said cap layer extends beyond a corresponding end of said first conductive layer.

* * * * *

UNITED STATES PATENT AND TRADEMARK OFFICE
CERTIFICATE OF CORRECTION

PATENT NO. : 5,882,968
APPLICATION NO. : 08/576752
DATED : March 16, 1999
INVENTOR(S) : Young Kwon Jun Page 1 of 1

It is certified that error appears in the above-identified patent and that said Letters Patent is hereby corrected as shown below:

In the Claims

Claim 5 presently reads "The method of claim 1, wherein a thickness of the first conductive layer is about 300 Å~1000 Å." Please amend claim 5 (col. 10, lines 46-47) to recite as follows:

5. The method of claim 1, wherein a thickness of a side wall of the first conductive layer is about 300 Å~1000 Å.

Signed and Sealed this
Twenty-ninth Day of September, 2015

Michelle K. Lee
*Director of the United States Patent and Trademark Office*